(12) United States Patent
Bouisse et al.

(10) Patent No.: US 9,257,946 B2
(45) Date of Patent: Feb. 9, 2016

(54) AMPLIFIER CIRCUITS

(71) Applicant: NXP B.V., Eindhoven (NL)

(72) Inventors: Gerard Jean-Louis Bouisse, Toulouse (FR); Jean-Jacques Bouny, Fontenilles (FR)

( * ) Notice: Subject to any disclaimer, the term of this patent is extended or adjusted under 35 U.S.C. 154(b) by 77 days.

(21) Appl. No.: 14/054,681

(22) Filed: Oct. 15, 2013

(65) Prior Publication Data

US 2014/0104004 A1  Apr. 17, 2014

(30) Foreign Application Priority Data

Oct. 16, 2012  (EP) .................................... 12290347

(51) Int. Cl.
| | | |
|---|---|---|
| *H03F 3/191* | (2006.01) | |
| *H03F 3/195* | (2006.01) | |
| *H03F 1/42* | (2006.01) | |
| *H03F 1/56* | (2006.01) | |
| *H03F 3/193* | (2006.01) | |
| *H03F 3/24* | (2006.01) | |

(52) U.S. Cl.
CPC ................. *H03F 3/195* (2013.01); *H03F 1/42* (2013.01); *H03F 1/565* (2013.01); *H03F 3/193* (2013.01); *H03F 3/245* (2013.01); *H03F 2200/255* (2013.01); *H03F 2200/36* (2013.01); *H03F 2200/387* (2013.01)

(58) Field of Classification Search
CPC ....................................................... H03F 3/191
USPC .............................................. 330/65–68, 302
See application file for complete search history.

(56) References Cited

U.S. PATENT DOCUMENTS

| 6,072,211 A | 6/2000 | Miller et al. |
|---|---|---|
| 6,229,408 B1 | 5/2001 | Jovanovich et al. |
| 7,986,184 B2 * | 7/2011 | Besling et al. .................. 330/67 |
| 2004/0041634 A1 | 3/2004 | Sugiura |
| 2004/0178854 A1 | 9/2004 | Inoue et al. |
| 2014/0179243 A1 | 6/2014 | Bouisse |

FOREIGN PATENT DOCUMENTS

| EP | 0 475 116 A3 | 3/1992 |
|---|---|---|
| EP | 1 347 572 A1 | 9/2003 |
| GB | 2118371 | 10/1983 |
| WO | WO 2009130544 A1 * | 10/2009 |

OTHER PUBLICATIONS

Extended European Search Report for Patent Appln. No. 12290347.9 (Mar. 7, 2013).
European Search Report for European Patent Appln. No. EP 12290346.1.

* cited by examiner

*Primary Examiner* — Steven J Mottola
(74) *Attorney, Agent, or Firm* — McDonnell Boehnen Hulbert & Berghoff LLP

(57) ABSTRACT

Radio Frequency (RF) amplifier circuits are disclosed which may exhibit improved video/instantaneous bandwidth performance compared to conventional circuits. For example, disclosed RF amplifier circuits may employ a baseband decoupling network connected in parallel with a low-pass RF matching network of the amplifier circuit.

7 Claims, 8 Drawing Sheets

AMPLIFIER CIRCUITS

CROSS-REFERENCE TO RELATED APPLICATIONS

This application claims the priority under 35 U.S.C. §119 of European patent application no. 12290347.9, filed on Oct. 16, 2012, the contents of which are incorporated by reference herein.

This invention relates to the field of amplifier circuits, and more particularly to radio frequency power amplifier circuits.

Power amplifier circuits are widely used in Radio Frequency (RF) applications. The video bandwidth, or instantaneous bandwidth, of a RF power amplifier represents the ability of the RF power amplifier to instantaneously amplify a linear signal (i.e. a signal with a variable envelope) without asymmetrical distortion.

Thus, the instantaneous bandwidth represents the broadest modulating signal that can be handled instantaneously by a RF power amplifier without asymmetrical distortion.

Asymmetry in signal distortion is generally unacceptable because it is difficult to correct.

For mobile communication applications, signal modulations have become increasingly wideband over the past years (from 200 kHz to 75 MHz today and >100 MHz in the future) so as to achieve higher data rates. Video bandwidth is therefore of growing importance and typically a discriminating factor in the field of amplification for mobile communication applications.

FIG. 1 is a schematic diagram of a conventional discrete (i.e. packaged) RF-LDMOS power amplifier 10. The amplifying transistors are located on silicon dies 12 provided within the package. The package 10 further includes a matching network consisting of bond wires 14 and discrete capacitors 16. Gate input leads 18 are connected to the transistor gates via gate-side capacitors 16g and drain output leads 20 are connected to the transistor drains via drain-side capacitors 16d.

Turning to FIG. 2, there is illustrated a set of bond-wire connections between capacitors and a die of the device of FIG. 1. The bond-wire connection between the gate-side capacitor 16g (Cpr) and the gate terminal G of the package has an inductance denoted Lg2, and the bond-wire connection between the gate-side capacitor 16g (Cpr) and the gate of the transistor on the die (DIE) has an inductance denoted Lg1. Similarly, the bond-wire connection between the drain of the transistor on the die (DIE) and the drain terminal D of the package has an inductance denoted Ld, and the bond-wire connection between the drain-side capacitor 16d (Cpo) and the drain of the transistor on the die (DIE) has an inductance denoted Li. An equivalent circuit diagram of the device of FIG. 1 illustrating the relative connections of the capacitances and inductances is provided in FIG. 3. From this, it will be seen that a capacitance Cpkg is present at each of the gate and drain terminals of the package (connected in parallel with the other capacitances), and that a source inductance Ls is associated with the source terminal of the package 10.

The conventional implementation described above leads to insufficient results in terms of video bandwidth (VBW) performance, signal distortion, and linearity degradation, and ultimately may not meet the minimum requirements imposed by modern telecommunications standards.

Proposed are concepts for improving VBW performance of a RF amplifier circuit.

According to an aspect of the invention there is provided a radio frequency amplifier circuit according to an independent claim.

Embodiments may employ a baseband decoupling network that is connected in parallel with an RF matching network of the amplifier circuit. Further, a low pass matching network may be employed at the output of the amplifying device, therefore providing a higher resonant frequency which meets desired video bandwidth requirements for modern applications like mobile telecommunications.

Embodiments thus relate to improving video bandwidth performance on the output side of an amplifier circuit.

Examples of the invention will now be described in detail with reference to the accompanying drawings, in which.

Figure 5A:
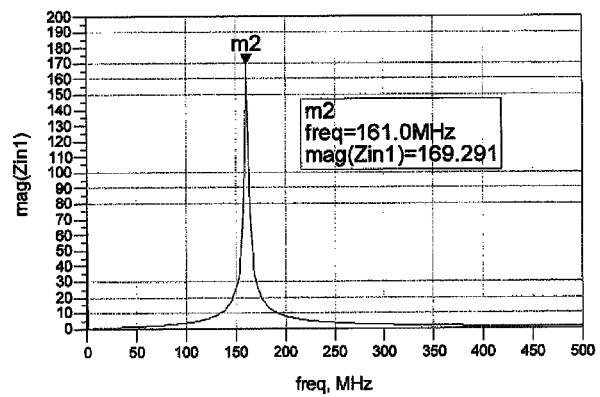
FIG. 5A is a graph illustrating a variation of the magnitude of baseband impedance with operating frequency for the RF amplifier circuit of FIG. 4.
Figure 5B:
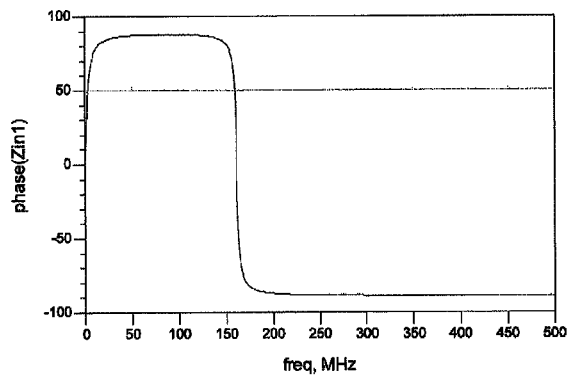
FIG. 5B is a graph illustrating a variation of the phase of baseband impedance with operating frequency for the conventional RF amplifier circuit of FIG. 4.

From left to right, the extreme left element 50 is a port, and represents the current source of the device (this is the reference plane for the impedance simulations from FIGS. 5A and 5B) The shunt capacitance 52 on its right, represents Cds, the shunt capacitance drain to source from the FET. Then the next three elements are matching elements inside the package (the series LC network 54 to ground, and the series inductance 56). The next shunt capacitance 58, represents the package lead.

On the right side of the lead, is represented the output matching network, to 50 ohms, on the PCB, and the connection to the power supply, through a quarter wave element, and RF and baseband decoupling shunt capacitors.

Figure 1:
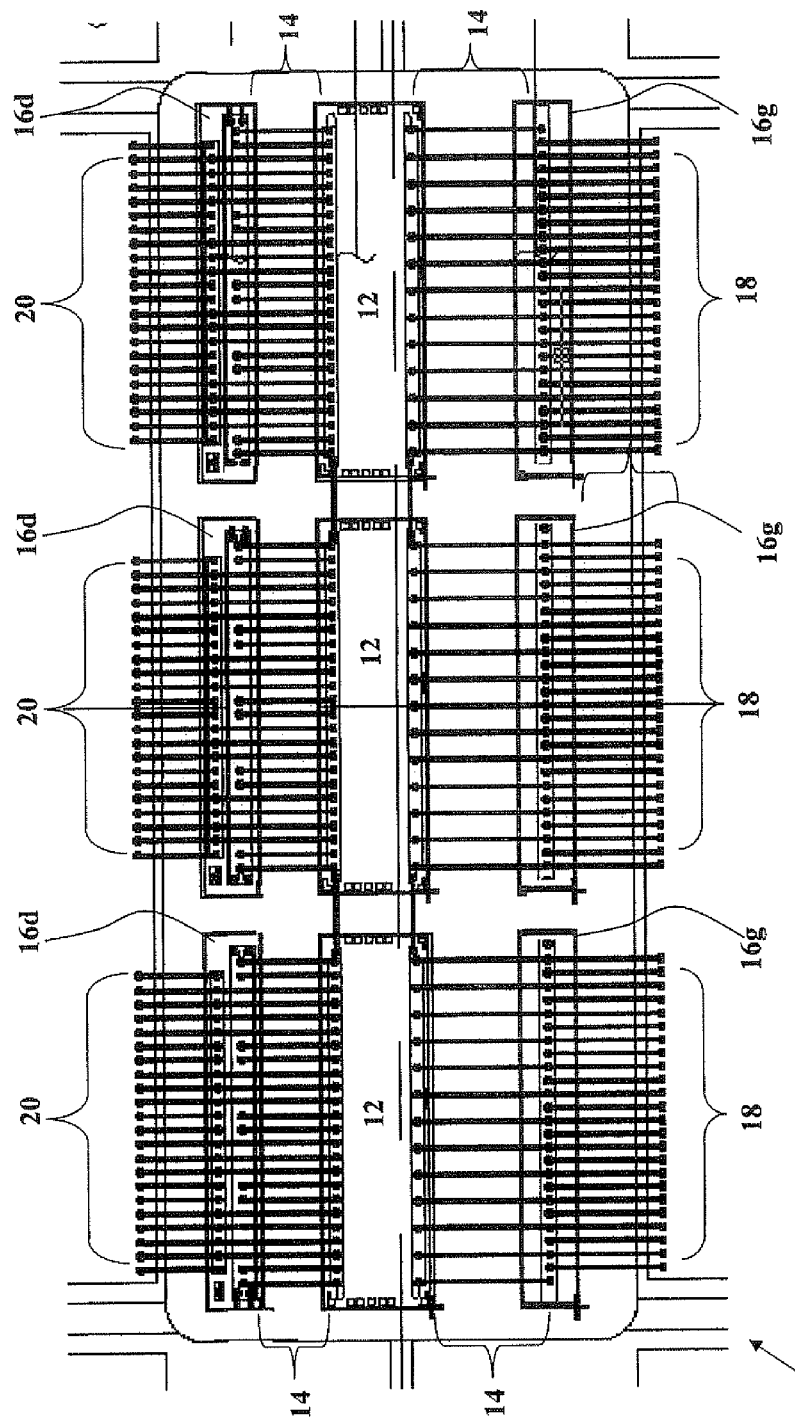
FIG. 1 is a schematic diagram of a conventional discrete (i.e. packaged) RF amplifier circuit.
Figure 2:
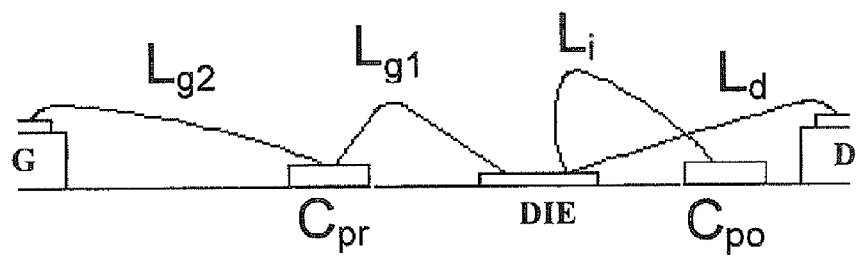
FIG. 2 illustrates a set of bond-wire connections between capacitors and a die of the device of FIG. 1.
Figure 3:
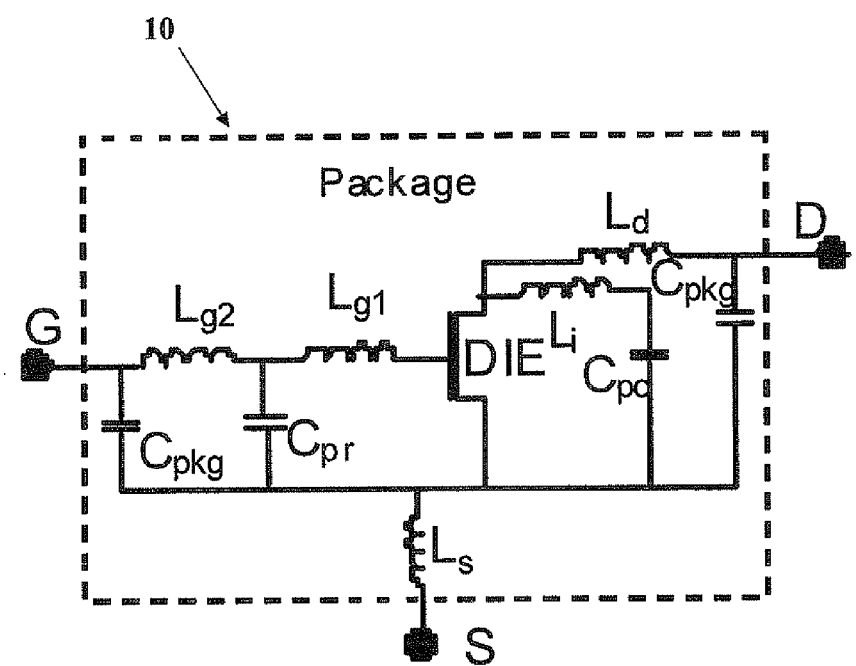
FIG. 3 is an equivalent circuit diagram of the device of FIG. 1 illustrating the relative connections of the capacitances and inductances.
Figure 4:
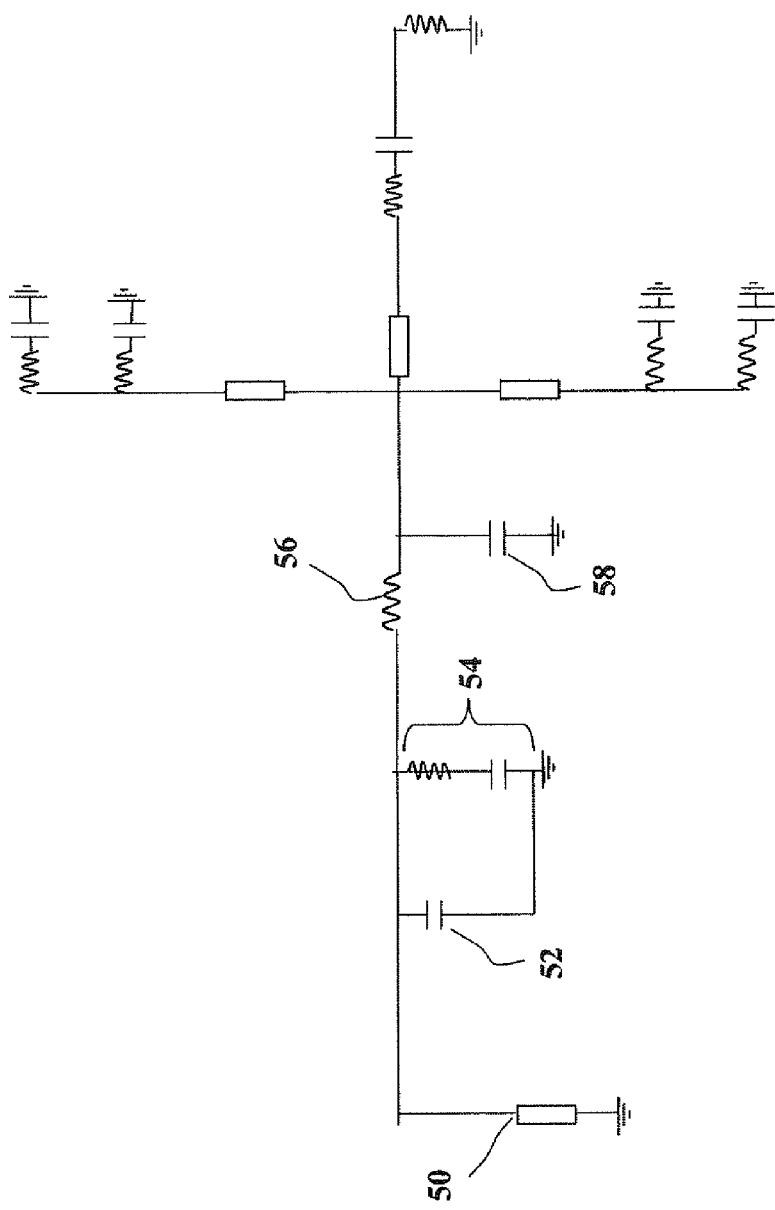
FIG. 4 is an electrical representation of a conventional output matching structure as it is used in an RF simulator.

Thus, in other words, FIG. 4 represents an electrical circuit, as used in a simulator, describing the typical passive elements from the current source of an active device to 50 ohms, through internal and external (to the package) matching elements, as well as connection to the DC power supply.

FIG. 5A is a graph illustrating a variation of the magnitude of baseband impedance with operating frequency for the RF amplifier circuit of FIG. 4. FIG. 5B is a graph illustrating a variation of the phase of baseband impedance with operating frequency for the conventional RF amplifier circuit of FIG. 4. FIGS. 5A and 5B thus illustrate the frequency response of the conventional RF amplifier circuit of FIG. 4. From FIGS. 5A and 5B it will be seen that the resonant frequency of the conventional RF amplifier circuit of FIG. 4 is 161 MHz. This does not meet desired video bandwidth requirements for modern applications like mobile telecommunications.

Figure 6:
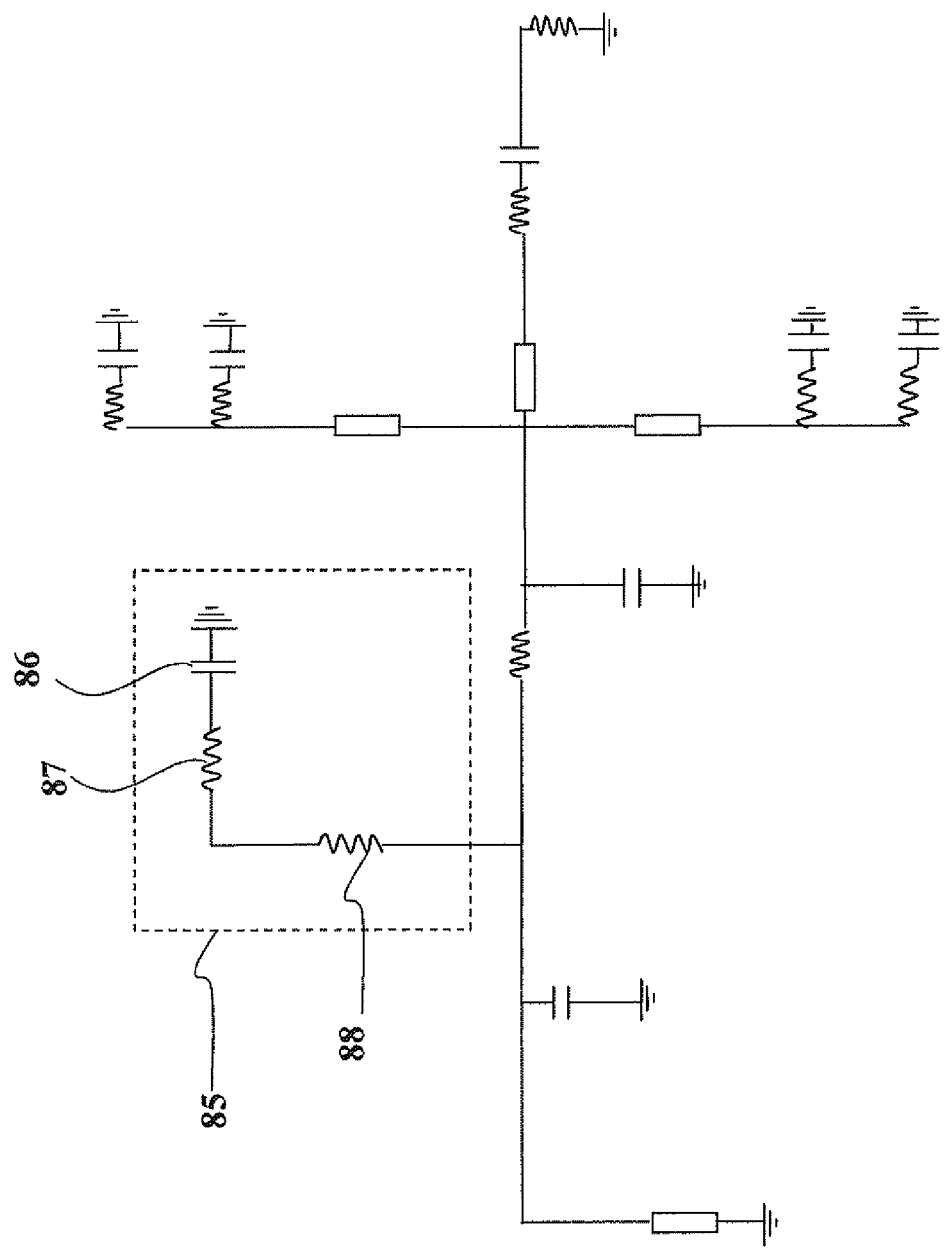
FIG. 6 is a schematic circuit diagram of a packaged RF amplifier circuit according to an embodiment of the invention.

FIG. 6 is a schematic circuit diagram of an RF amplifier circuit according to another embodiment. It will be seen that the circuit of FIG. 6 differs from the conventional circuit of FIG. 4 in that the shunt inductance arrangement has been removed to leave a low pass capacitor arrangement. Also, the circuit comprises an additional baseband decoupling network (identified by a dashed line labelled 85) in parallel with the RF matching network. The baseband decoupling network 85 is provided in addition to any envelope decoupling network that may be present external to a package of the circuit. This extra baseband decoupling network 85 comprises a decoupling capacitor 86 and two further inductances 87 and 88 connected in series between the drain side RF decoupling capacitance 16d and ground.

Figure 7:
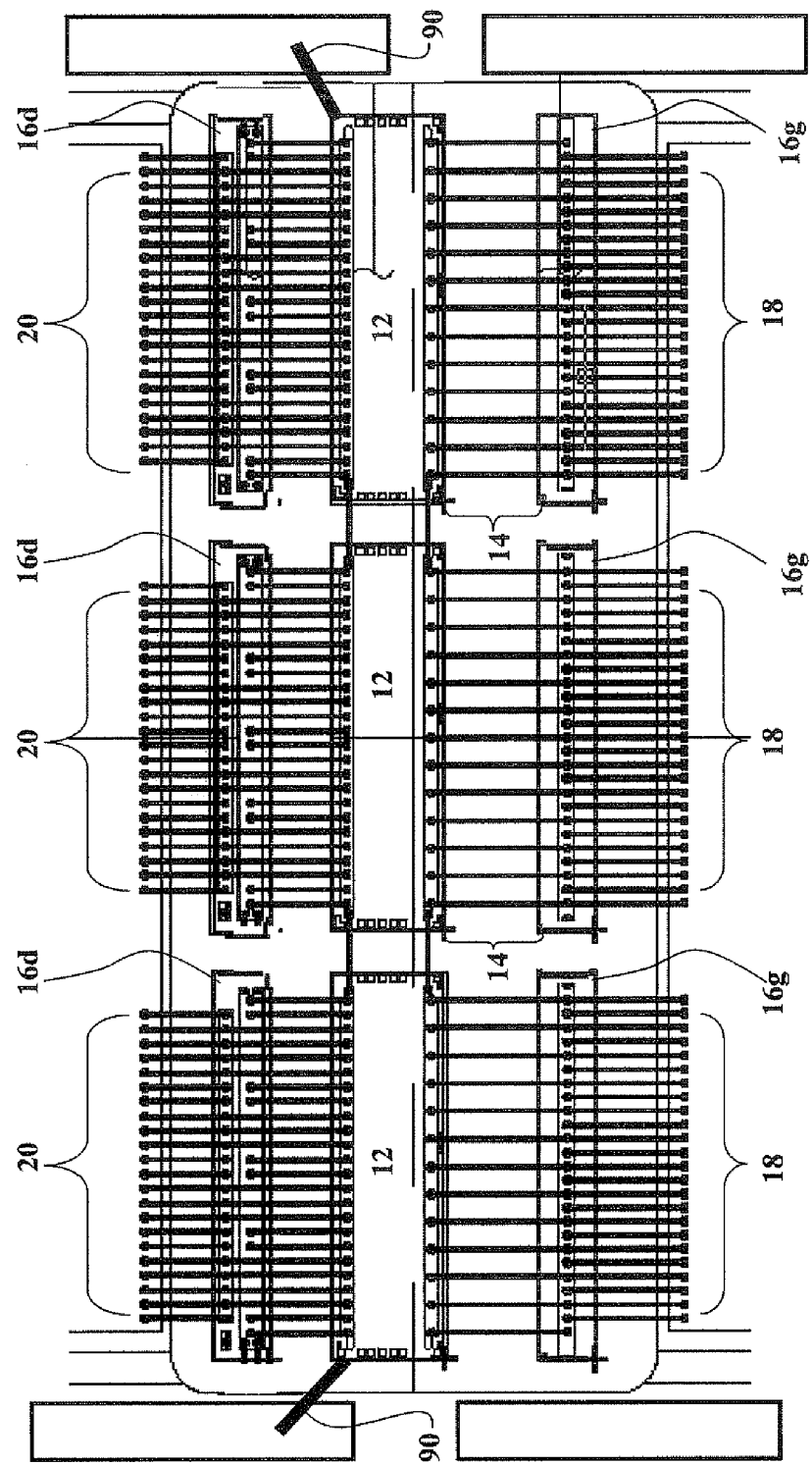
FIG. 7 is a plan view of the packaged RF amplifier circuit of FIG. 6, wherein the cover of the package has been removed.

As shown in FIG. 7, the output of the amplifying device is then connected, via a wire bond 90, to a low pass matching network of the metallised portion of the alumina conducting ring. This arrangement provides a short connecting inductance to the amplifier circuit.

Figure 8A:
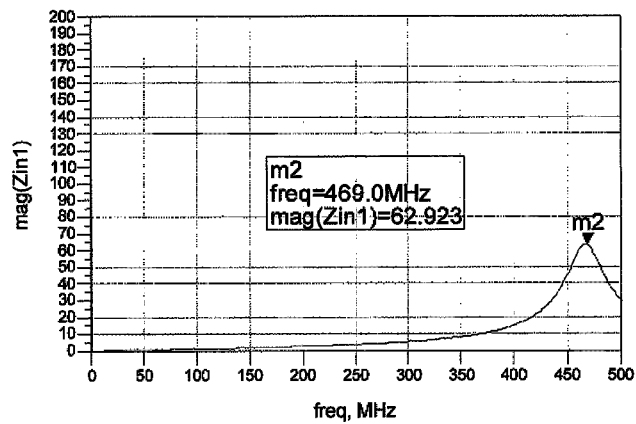
FIG. 8A is a graph illustrating a variation of the magnitude of baseband impedance with operating frequency for the RF amplifier circuit of FIGS. 6 and 7.
Figure 8B:
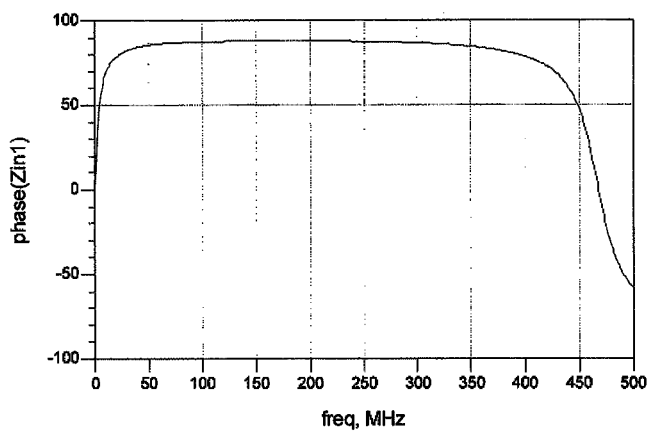
FIG. 8B is a graph illustrating a variation of the phase of baseband impedance with operating frequency for the RF amplifier circuit of FIGS. 6 and 7.

FIG. 8A is a graph illustrating a variation of the magnitude of baseband impedance with operating frequency for the RF amplifier circuit of FIGS. 6 and 7. FIG. 8B is a graph illustrating a variation of the phase of baseband impedance with operating frequency for the RF amplifier circuit of FIGS. 6 and 7. FIGS. 8A and 8B thus illustrate the frequency response of the RF amplifier circuit according to the embodiment of FIGS. 6 and 7. From FIGS. 8A and 8B it will be seen that the resonant frequency of the embodiment of FIGS. 6 and 7 is significantly increased when compared to the conventional circuit of FIG. 4. Embodiments employing the described concept of using a low pass matching network at the output of the amplifying device, in conjunction with an additional decoupling network, therefore have a higher resonant frequency which meets desired video bandwidth requirements for modern applications like mobile telecommunications.

Figure 9:
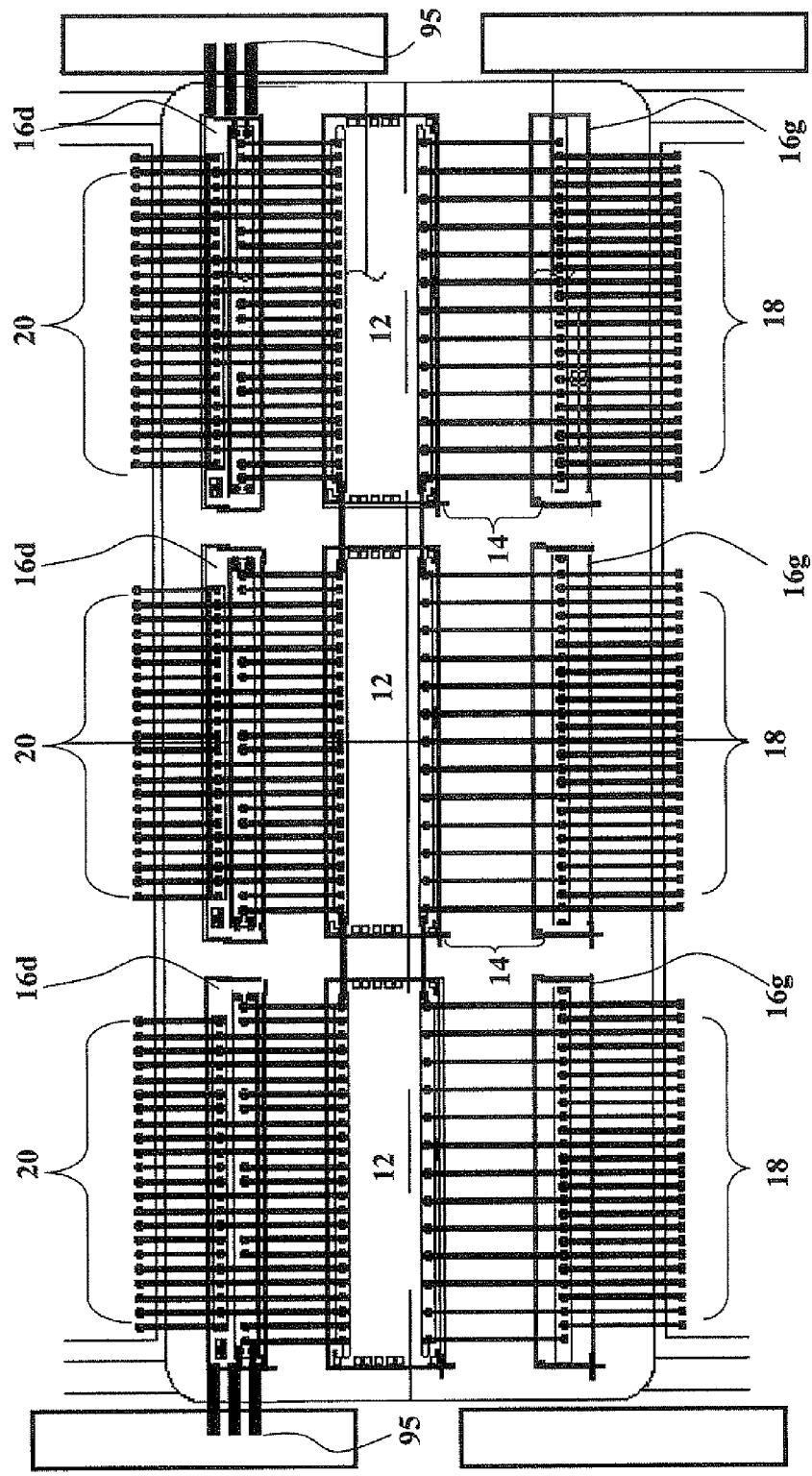
FIG. 9 is a plan view of a packaged RF amplifier circuit according to another embodiment of the invention, wherein the cover of the package has been removed.

The embodiment shown in FIGS. 6 and 7 may be modified as shown in FIG. 9. Here, the low pass matching network of the metallised portion of the alumina conducting ring is connected to the RF decoupling capacitance 16d on the drain side of the amplifier circuit using a plurality of parallel wire bonds 95. This arrangement provides a short connecting inductance. Specifically, the plurality of bond wires 95 used for the connection realises a small inductance.

Embodiments employ a concept of improving video bandwidth on the output side with a low pass pre-matching network. A low pass matching network may be used, inside a packaged RF amplifier circuit, at the output of the amplifying device in parallel with RF matching network, connected in parallel to the drain of the transistor or the shunt capacitance of the package. Such connection of a capacitance to the transistor drain or shunt capacitance of the RF matching network may be made using an inductive connection of large enough value to be a choke but not too large to reduce video bandwidth performance.

Embodiments thus provide RF amplifier circuit arrangements having improved video bandwidth and/or signal distortion performance.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A radio frequency (RF) amplifier circuit comprising:
a packaged amplifier circuit having a transistor connected to an output of the packaged amplifier circuit, the packaged amplifier circuit further comprising, between the transistor and the output:
a low-pass RF matching network comprising an un-shunted RF matching capacitance connected to ground; and
a baseband decoupling network connected in parallel with the low-pass RF matching network, the baseband decoupling network comprising a series arrangement comprising a decoupling capacitor and an inductance connected in series between a drain of the transistor and ground, wherein the baseband decoupling network is provided inside the package and the output of the packaged amplifier circuit is configured to be connected to a low pass matching network via an inductive connection.

2. The RF amplifier circuit of claim 1, wherein the inductance comprises a pair of inductors connected in series.

3. The RF amplifier circuit of claim 1, wherein the inductive connection comprises at least one wire bond.

4. The RF amplifier circuit of claim 1, wherein the RF matching capacitance is connected to a low pass matching network via an inductive connection.

5. The RF amplifier circuit of claim 4, wherein the inductive connection comprises at least one wire bond.

6. An integrated circuit comprising the RF amplifier circuit according to claim 1.

7. A mobile base station comprising the RF amplifier circuit according to claim 1.

* * * * *